US009484295B2

(12) United States Patent
Park et al.

(10) Patent No.: US 9,484,295 B2
(45) Date of Patent: Nov. 1, 2016

(54) IMAGE FORMING APPARATUS, CHIP, AND CHIP PACKAGE TO REDUCE CROSS-TALK BETWEEN SIGNALS

(71) Applicant: SAMSUNG ELECTRONICS CO., LTD., Suwon-si (KR)

(72) Inventors: Seung-hun Park, Suwon-si (KR); Eun-ju Hong, Seoul (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 14/513,720

(22) Filed: Oct. 14, 2014

(65) Prior Publication Data
US 2015/0041968 A1    Feb. 12, 2015

Related U.S. Application Data

(62) Division of application No. 12/485,369, filed on Jun. 16, 2009, now Pat. No. 8,844,423.

(30) Foreign Application Priority Data

Nov. 10, 2008    (KR) .......................... 10-2008-0111162

(51) Int. Cl.
H01L 23/52    (2006.01)
H01L 23/50    (2006.01)
(Continued)

(52) U.S. Cl.
CPC .............. *H01L 23/50* (2013.01); *H01L 24/09* (2013.01); *H01L 24/49* (2013.01); *H01L 25/167* (2013.01); *H01L 27/14618* (2013.01); *H01L 23/49816* (2013.01); *H01L 2224/05554* (2013.01); *H01L 2224/45139* (2013.01); *H01L 2224/48091* (2013.01); *H01L 2224/48105* (2013.01);
(Continued)

(58) Field of Classification Search
CPC ................ H01L 2924/00; H01L 2924/00014; H01L 2224/73265; H01L 2224/48227; H01L 2924/00012; H01L 2224/48247; H01L 2224/48091; H01L 2224/49171; H01L 2224/32245; H01L 2224/32225; H01L 2224/97; H01L 2924/181; H01L 2224/48237; H01L 2224/49; H01L 23/50; H01L 27/14618
USPC ......................................... 257/691, E23.169
See application file for complete search history.

(56) References Cited

U.S. PATENT DOCUMENTS 6,962,827 B1 * 11/2005 Furue et al. .................... 438/14
2003/0080357 A1    5/2003 Tsai et al.
(Continued)

FOREIGN PATENT DOCUMENTS

JP    10-074791    3/1998

OTHER PUBLICATIONS

U.S. Species Election Requirement mailed Mar. 16, 2011 in copending U.S. Appl. No. 12/485,369.
(Continued)

Primary Examiner — Duy T Nguyen
(74) Attorney, Agent, or Firm — Staas & Halsey LLP

(57) ABSTRACT

An image forming apparatus including an engine unit to perform an image forming operation, and a board unit to control the engine unit. The board unit includes at least one chip package that includes a chip. The chip includes first pads to transmit a first type of signal, a second pad to transmit a second type of signal, and a third pad interposed between the first and second pads, to reduce cross-talk between the first and second types of signals.

7 Claims, 7 Drawing Sheets

(51) Int. Cl.
*H01L 27/146* (2006.01)
*H01L 23/00* (2006.01)
*H01L 25/16* (2006.01)
*H01L 23/498* (2006.01)

(52) U.S. Cl.
CPC ............... *H01L2224/48227* (2013.01); *H01L 2224/48237* (2013.01); *H01L 2224/49* (2013.01); *H01L 2224/49175* (2013.01); *H01L 2924/00014* (2013.01); *H01L 2924/14* (2013.01); *H01L 2924/145* (2013.01); *H01L 2924/1433* (2013.01); *H01L 2924/1435* (2013.01); *H01L 2924/1438* (2013.01); *H01L 2924/15311* (2013.01); *H01L 2924/181* (2013.01)

(56) References Cited

U.S. PATENT DOCUMENTS

| | | | |
|---|---|---|---|
| 2005/0073033 A1 | 4/2005 | Yoo | |
| 2005/0231889 A1 | 10/2005 | Tsuji | |
| 2006/0211282 A1* | 9/2006 | Onogi et al. | 439/127 |
| 2006/0244117 A1 | 11/2006 | Karnezos et al. | |
| 2007/0029662 A1 | 2/2007 | Lee | |
| 2007/0040247 A1 | 2/2007 | Lee et al. | |
| 2007/0222055 A1 | 9/2007 | Jensen et al. | |
| 2007/0290302 A1 | 12/2007 | Nakagawa et al. | |
| 2008/0122064 A1 | 5/2008 | Itoh et al. | |
| 2008/0129718 A1 | 6/2008 | Nishimura et al. | |
| 2008/0135960 A1* | 6/2008 | Danno et al. | 257/428 |

OTHER PUBLICATIONS

U.S. Office Action mailed May 4, 2011 in copending U.S. Appl. No. 12/485,369.
U.S. Final Office Action mailed Sep. 19, 2011 in copending U.S. Appl. No. 12/485,369.
U.S. Office Action mailed Mar. 12, 2013 in copending U.S. Appl. No. 12/485,369.
U.S. Final Office Action mailed Aug. 8, 2013 in copending U.S. Appl. No. 12/485,369.
U.S. Advisory Action mailed Oct. 21, 2013 in copending U.S. Appl. No. 12/485,369.
U.S. Office Action mailed Feb. 21, 2014 in copending U.S. Appl. No. 12/485,369.
U.S. Notice of Allowance mailed Jul. 1, 2014 in copending U.S. Appl. No. 12/485,369.
U.S. Appl. No. 12/485,369, filed Jun. 16, 2009, Seung-hun Park et al., Samsung Electronics Co., Ltd.
U.S. Patent Office Action mailed Jan. 5, 2015 in copending U.S. Appl. No. 14/499,696.
U.S. Final Office Action mailed Mar. 20, 2015 in co-pending U.S. Appl. No. 14/499,696.
U.S. Office Action issued Jan. 25, 2016 in copending U.S. Appl. No. 14/499,696.
U.S. Appl. No. 14/499,696, filed Sep. 29, 2014, Seung-hun Park et al., Samsung Electronics Co., Ltd.
U.S. Office Action issued Sep. 16, 2015 in copending U.S. Appl. No. 14/499,696.
U.S. Office Action issued Apr. 19, 2016 in copending U.S. Appl. No. 14/499,696.

* cited by examiner

IMAGE FORMING APPARATUS, CHIP, AND CHIP PACKAGE TO REDUCE CROSS-TALK BETWEEN SIGNALS

CROSS-REFERENCE TO RELATED APPLICATIONS

This application is a divisional application of U.S. patent application Ser. No. 12/485,369, now U.S. Pat. No. 8,884,423, filed Jun. 16, 2009, and is related to and claims the priority benefit of Korean Patent Application No. 10-2008-0111162, filed on Nov. 10, 2008, in the Korean Intellectual Property Office, the disclosures of which are incorporated herein by reference.

BACKGROUND

1. Field

Aspects of the present invention relate to an image forming apparatus, a chip, and a chip package.

2. Description of the Related Art

Currently, integrated circuits, such as semiconductor memory circuits, are getting smaller in size, while having higher performance. The effect of a package structure on such integrated circuits is becoming more important. In particular, a technique of effectively arranging and routing pads greatly affects the performance of integrated circuits.

A conventional integrated circuit was free from a limitation on the chip size, and thus, much effort was not required to design the chip package structure, so as to ensure high performance. In other words, it was easy to insure that bonding wires and pads in a conventional chip package had sufficient separation distances.

However, as chips have become smaller, gaps between neighboring gates and bonding wires have become narrower. Also, as the clock frequency of chips becomes higher, a higher level of cross-talk can occur between signals transmitted through the pads, due to the close proximity of the pads and bonding wires. Cross-talk refers to a signal induced phenomenon that occurs among neighboring nets, that is, a co-signal interference phenomenon.

Cross-talk is a serious problem among different signal types, such as between data signals and address signals, and between data signals and control signals. This is because cross-talk occurring in one signal type induces cross-talk in other signal types.

FIG. 5 shows a simulation wave diagram illustrating the effect of cross-talk in a conventional chip package. Referring to FIG. 5, a data signal and an address signal, which are transmitted in close proximity to each other, have different frequencies and different phases. Accordingly, the address signal may change when the data signal maintains a predetermined electric potential, and the change in the address signal induces a change in the neighboring data signal, thereby causing cross-talk.

In order to prevent cross-talk, pads and bonding wires of a package should be designed to have sufficient separation distances from one another. However, as the degree of integration of chips becomes higher, it is difficult to ensure sufficient separation distances. Therefore, there is a demand for a chip package that is designed to prevent cross-talk, while maintaining a high degree of integration.

SUMMARY

Aspects of the present invention provide an image forming apparatus, a chip, and a chip package, to reduce cross-talk between signals.

According to an aspect of the present invention, there is provided an image forming apparatus including an engine unit to perform an image forming operation, and a board unit to control the engine unit. The board unit may include at least one chip package that includes a chip. The chip includes first pads to transmit a first type of signal, a second pad to transmit a second type of signal, and a third pad interposed between the first and second pads, to reduce cross-talk between the first and second types of signals.

According to an aspect of the present invention, the chip may further include a fourth pad to transmit a third type of signal, and a fifth pad disposed between the second and fourth pads, to reduce cross-talk between the second and third types of signals.

According to an aspect of the present invention, the first, second, and third pads may be linearly arranged on the chip.

According to an aspect of the present invention, the chip package may further include a substrate to support the chip, a packaging unit to encase the chip on the substrate, bonding fingers disposed on the substrate, bonding wires to electrically connect the bonding fingers to the pads, via holes vertically penetrating through the substrate, and connectors to electrically connect the bonding fingers and the via holes.

According to an aspect of the present invention, the chip package may further include a ground layer embedded in the substrate, under the bonding wires.

According to an aspect of the present invention, the third pad may be a ground pad to transmit a fixed electric potential to the chip.

According to an aspect of the present invention, the first and second types of signals may be different signals selected from data signals, address signals, and control signals.

According to another aspect of the present invention, there is provided a chip including first pads to transmit a first type of signal, a second pad to transmit a second type of signal, and a third pad interposed between the first and second pads, to reduce cross-talk between the first and second types of signals.

According to an aspect of the present invention, the chip may further include a fourth pad to transmit a third type of signal, and a fifth pad disposed between the second and fourth pads, to reduce cross-talk between the second and third types of signals.

According to an aspect of the present invention, the first, second, and third pads may be linearly arranged on the substrate.

According to an aspect of the present invention, the third pad may be a ground pad to transmit a fixed electric potential to the chip.

According to an aspect of the present invention, the first and second types of signals may be different signals selected from data signals, address signals, and control signals.

According to still another aspect of the present invention, there is provided a chip package including a substrate, a chip mounted on the substrate, including first pads to transmit a first type of signal, a second pad to transmit a second type of signal, and a third pad interposed between the first and second pads, to reduce cross-talk between the first and second types of signals.

According to an aspect of the present invention, the chip may further include a fourth pad to transmit a third type of signal, and a fifth pad disposed between the second and fourth pads, to reduce cross-talk between the second and third types of signals.

According to an aspect of the present invention, the first, second, and third pads may be linearly arranged on the chip.

According to an aspect of the present invention, the chip package may further include a packaging unit to encase the chip, bonding fingers connected to the pads through bonding wires, via holes extending through the substrate, and connectors to electrically connect the bonding fingers and the via holes.

According to an aspect of the present invention, the chip package may further include a ground layer embedded in the substrate, under the bonding wires.

According to an aspect of the present invention, the third pad may be a ground pad to transmit a fixed electric potential to the chip.

According to an aspect of the present invention, the first and second types of signals may be different signals selected from data signals, address signals, and control signals.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF EMBODIMENTS

Figure 1:
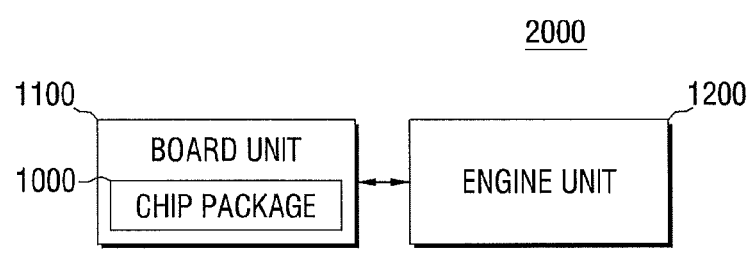
FIG. 1 is a block diagram illustrating an image forming apparatus, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

FIG. 1 is a block diagram illustrating an image forming apparatus 2000, according to an exemplary embodiment of the present invention. Referring to FIG. 1, the image forming apparatus 2000 includes a board unit 1100 and an engine unit 1200.

The engine unit 1200 performs one or more operations to form an image on a printable medium, such as paper or the like. Since the constitution and operation of the engine unit 1200 is the same as the engine unit of a conventional image forming, a detailed description thereof is omitted.

The board unit 1100 controls the engine unit 1200. More specifically, the board unit 1100 receives an image forming job from an external terminal device (not shown) and controls the engine unit 1200 to perform various operations, so as to perform the image forming job. The board unit 1100 includes at least one chip package 1000 including a chip (not shown). The chip includes first pads (not shown), at least one second pad (not shown) that transmits a signal group different from that of the first pads, and a third pad (not shown) that is interposed between the first pads and the second pad, to reduce signal cross-talk. The chip package 1000 will be described in more detail, with reference to FIGS. 2 and 3 below.

Figure 2:
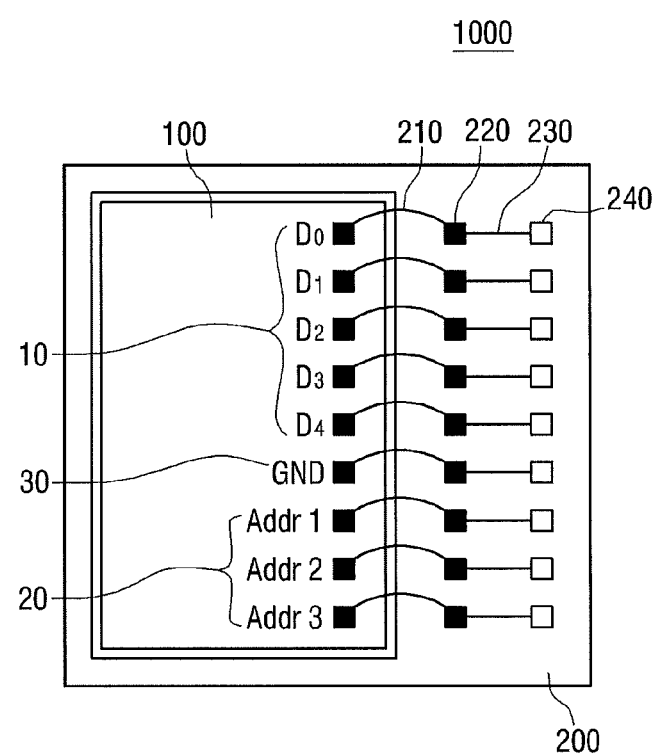
FIG. 2 is a plane view illustrating a chip package, according to an exemplary embodiment of the present invention.
Figure 3:
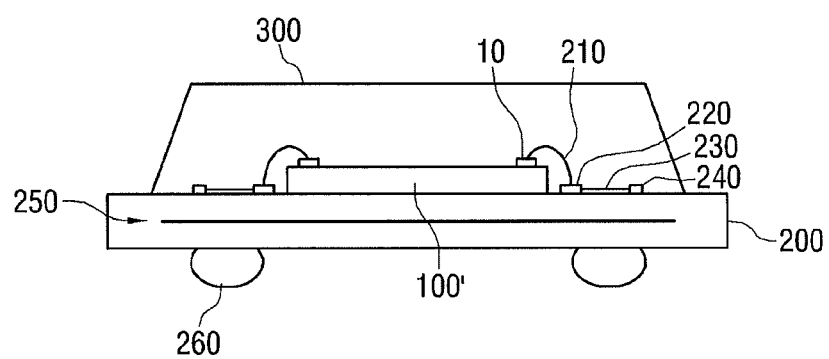
FIG. 3 is a cross-section view illustrating the chip package of FIG. 2.

FIG. 2 is a plane view illustrating the chip package 1000, according to an exemplary embodiment of the present invention. FIG. 3 is a cross-section view of the chip package 1000 of FIG. 2. Referring to FIGS. 2 and 3, the chip package 1000 includes a chip 100, a substrate 200, and a packaging unit 300.

The chip 100 includes first pads 10, second pads 20, and a third pad 30. The chip 100 may be an integrated circuit chip, such as a semiconductor memory circuit including a random access memory (RAM), a read only memory (ROM), and/or a flash memory, or may be an application specific integrated circuit (ASIC) chip.

The first pads 10 are linearly arranged on one surface of the chip 100. The first pads 10 can be used for transmitting data signals, address signals, and/or control signals. For example, the first pads 10 may transmit data signals D0 to D4. The data signals may include a data input/output signal, a data strobe signal, and/or an input data mask signal.

The first pads 10 are terminals of an internal circuit (not shown) of the chip 100. The first pads 10 are disposed to facilitate the attachment of a bonding wire to the chip 100. In particular, the first pads 10 are terminals to electrically connect the internal circuit to an external circuit.

The second pads 20 are used to transmit different types of signals from the first pads 10. More specifically, the second pads 20 are used for transmitting one type of signal, i.e. the data signals, the address signals, or the control signals, which is not being transmitted by the first pads 10. For example, if the first pads 10 are used to transmit data signals, the second pads 20 may be used to transmit the address signals or the control signals. In particular, the second pads 20 may be used to transmit address signals Addr 1 to Addr 3. The address signals may be an address input signal, a bank address signal, a row address strobe signal, and/or a column address strobe signal. The second pads 20 may be plural in number, as shown in FIG. 2, and each second pad 20 may transmit one of the address signals Addr 1 to Addr 3. In the alternative, only one second pad 20 may be provided, or any suitable number of second pads 20 may be provided.

The first pads 10, the second pads 20, and the third pad 30 can be linearly arranged on the substrate 200, with the third pad 30 being disposed between groups of the first and second pads 10, 20. The third pad 30 is interposed between the first pads 10 and the second pads 20, to reduce cross-talk between the signals transmitted through the first pads 10 and the signals transmitted through the second pads 20. More specifically, the third pad 30 can be a ground pad to transmit signals having a fixed electric potential, to the chip 100. For example, if the first pads 10 are used to transmit the data signals, the second pads 20 are used to transmit the address signals, and the first and second pads 10, 20 are disposed adjacent to each other, a significant amount of cross-talk can occur between the transmitted signals. Therefore, the third pad 30 is interposed between the first pads 10 and the second pads 20.

The third pad 30 may be a pad that is additionally installed to reduce cross-talk between the signals transmitted through the first and second pads 10, 20. In the alternative, the third pad 30 can be a ground pad conventionally used to transmit a fixed voltage, to drive the chip 100. Accordingly, the chip 100 can substantially reduce cross-talk, by including the third pad 30 between different groups of pads in an integrated circuit, in which it is difficult to ensure sufficient separation distances between pads and/or wires.

The packaging unit 300 is disposed above the chip 100 and the substrate 200, to protect various patterns on the chip 100 and the substrate 200. The packaging unit 300 may contact the chip 100 and the substrate 200, or may be spaced apart from the chip 100 and the substrate 200, thereby enclosing an empty space.

The chip 100 is mounted on the substrate 200. The substrate 200 includes: bonding wires 210, bonding fingers 220, connectors 230, via holes 240, a ground layer 250, and a ball 260.

The bonding fingers 220 are each connected to one of the pads 10, 20, 30, through the bonding wires 210. More specifically, the bonding fingers 220 are arranged on an edge of the substrate 200, and the bonding fingers 220 are electrically connected to an external pin, or the ball 230, through the connectors 230 and the via holes 240. The via holes may include pins or terminals to transmit signals from the connectors 230.

In FIG. 2, the bonding fingers 220 are shown on the right side of the chip 100. However, the pads 10, 20, 30 may be arranged on any side of the chip 100, and the bonding fingers 220 may be arranged on the substrate 200 in corresponding positions.

The connectors 230 electrically connect the bonding fingers 220 to the via holes 240. The bonding wires 210 electrically connect the first pads 10, 20, 30 to the bonding fingers 220.

The via holes 240 extend through the substrate 200. More specifically, the via holes 240 transmit signals received from the pads 10, 20, 30, through the bonding wires 210, the bonding fingers 220 and the connectors 230, to the balls 260 located under the substrate 200. One of the via holes 240 can be electrically connected to the third pad 30 and the ground layer 250, which is embedded in the substrate 200.

As shown in FIGS. 2 and 3, the first pads 10 and the second pads 20 are electrically connected to corresponding bonding fingers 220, through bonding wires 210. The third pad 30, which can be a ground pad, is interposed between the first pads 10 and the second pads 20. That is, since a ground pattern is interposed between the first and second pads 10, 20, cross-talk between the different types of signals transmitted by the first and second pads 10, 20, can be reduced. In addition, the ground layer 250 is formed in the substrate 200, under the bonding wires 210, to further reduce the cross-talk.

Although FIGS. 2 and 3 illustrates a single chip 100, the present invention is applicable to a multi-chip package, in which two or more of the chips 100 are packaged on the substrate 200.

Although the first pads 10 are recited to transmit data signals and the second pads 20 are recited to transmit address signals, the first and second pads 10, 20 may transmit different types of signals selected from the data signals, the address signals, and the control signals. In the alternative, the first and second pads 10, 20 may transmit other types of signals, so long as they transmit different types of signals.

In the above embodiment, the third pad 30 is interposed between the first pads 10 and the second pads 20, to reduce cross-talk. However, according to some aspects, multiple pads can be included to reduce cross-talk, as shown in FIG. 4.

Figure 4:
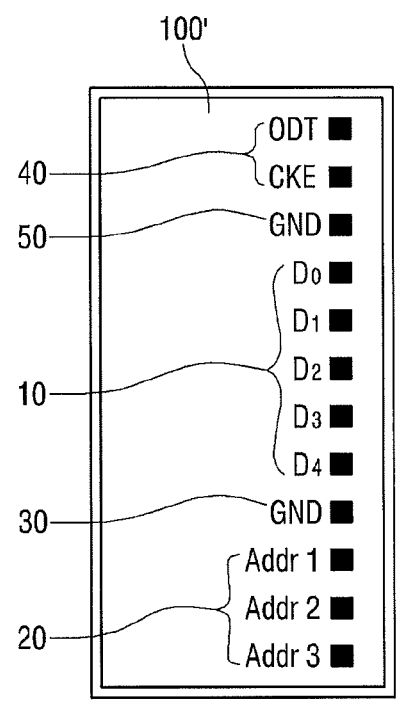
FIG. 4 is a plane view illustrating a chip, according to another exemplary embodiment of the present invention.
Figure 5:
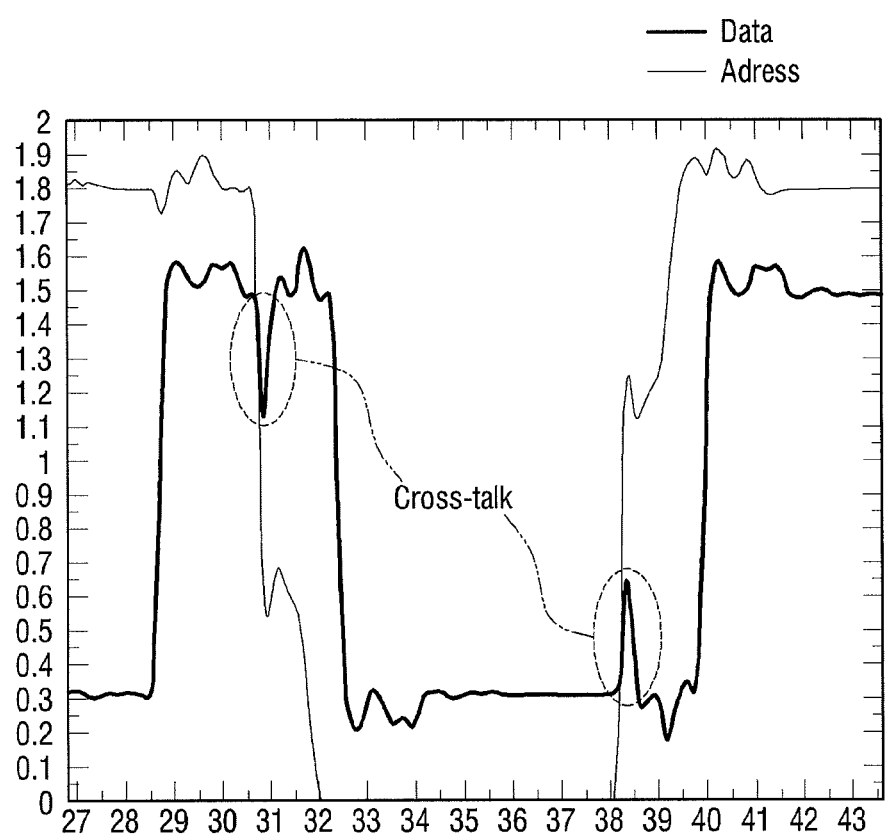
FIG. 5 is a simulation wave diagram illustrating the effect of cross-talk in a conventional chip package.

FIG. 4 is a plane view illustrating a chip 100', according to another exemplary embodiment of the present invention. Referring to FIG. 4, the chip 100' includes first pads 10, second pads 20, a third pad 30, fourth pads 40, and a fifth pad 50, which are arranged linearly. Since the first pads 10, the second pads 20, and the third pad 30 are the same as those of FIG. 2, a detailed description thereof is omitted.

The fourth pads 40 are used to transmit different types of signals than the first and second pads 10, 20. For example, the fourth pads 40 may be used to transmit control signals. The control signals may be on die termination signals (ODT), chip select signals, or clock enable signals (CKE).

The fifth pad 50 reduces cross-talk between the signals transmitted by fourth pads 40 and the first pads 10 and/or between the fourth pads 40 and the second pads 20. More specifically, the fifth pad 50 can be an additional pad, or a ground pad to transmit signals having a fixed electric potential, which is arranged between the fourth pads 40 and the first pads 10. If the fourth pads 40 are arranged adjacent to the second pads 20, the fifth pad 50 can be arranged between the fourth pads 40 and the second pads 20.

The fifth pad 50 may be an additional pad which is installed to reduce cross-talk between the signals transmitted through the fourth pads 40 and the first pads 10, or between the second pads 20 and the fourth pads 40. The fifth pad 50 may be a ground pad to transmit a fixed electric potential to the chip 100', to drive the chip 100'.

Although the first-fifth pads 10, 20, 30, 40, 50 are shown to be arranged on the right side of the chip 100' in the above embodiment, they may be arranged on any suitable side of the chip 100'. Accordingly, the image forming apparatus 2000 can reduce cross talk and prevent internal malfunctions, by including ground pads to an integrated circuit, in which it is difficult to ensure sufficient separation distances between pads.

Figure 6A:
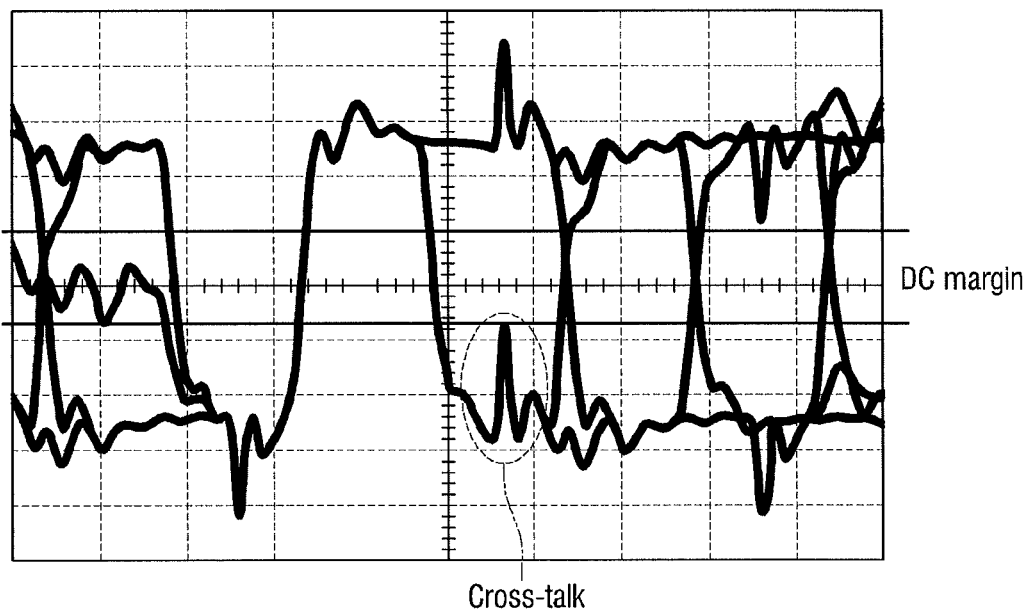
FIGS. 6A and 6B are simulation wave diagrams illustrating the effect of cross-talk in a conventional chip package and in a chip package according to an exemplary embodiment of the present invention, respectively.

FIG. 6A is a signal wave diagram illustrating the effect of cross-talk between different signal types in a conventional chip package, wherein gaps between pads/wires of the chip package are constant. Referring to FIG. 6A, it can be seen that cross-talk occurred between two signal types, because pads for transmitting the signal types are in close proximity to each other. The dotted circle shows that the cross-talk almost reaches a DC margin, increasing the possibility of a malfunction.

Figure 6B:
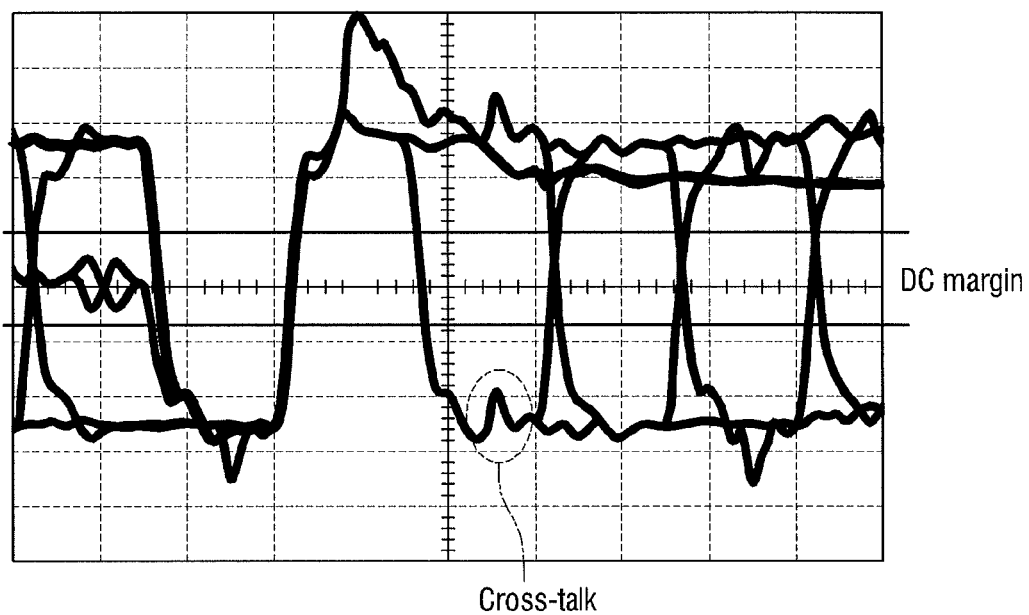

FIG. 6B is a signal wave diagram illustrating the effect of cross-talk occurring different signal groups, in a chip package according to an exemplary embodiment of the present invention, wherein the gaps between pads/wires of the chip package are constant. Referring to FIG. 6B, it can be seen that cross talk occurs between two signal types, but is reduced by a ground pad disposed between the pads transmitting the different signal types.

Accordingly, the chip package 1000 can easily reduce cross-talk, by including a ground pad between pads that transmit different types of signals, even if it is difficult to ensure sufficient separation distances between the pads.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:
1. A chip package comprising,
a substrate, and a chip mounted on the substrate, comprising:

first pads consecutively arranged with respect to each other and disposed on the chip and different pads of the first pads are configured to transmit different first signals which are either data signals or control signals;

a second pad disposed on the chip and configured to transmit second signals which are address signals; and a first ground pad disposed on the chip between the first pads and the second pad, the first ground pad configured to reduce cross-talk between the first signals and the second signals, wherein the first pads, the first ground pad, and the second pad are consecutively arranged on the chip.

2. The chip package as claimed in claim 1, further comprising:

a third pad disposed on the chip and configured to transmit third signals which are one of the data signals and the control signals and are different signal types than the first signals; and a second ground pad disposed on the chip between the second pad and the third pad, the second ground pad configured to reduce cross-talk between the second signals and third signals.

3. The chip package as claimed in claim 1, wherein the first pads, the second pad, and the first ground pad are linearly arranged on the chip.

4. The chip package as claimed in claim 1, further comprising:

a packaging unit to encase the chip on the substrate;

bonding fingers disposed on the substrate;

bonding wires to electrically connect the bonding fingers to the first pads, the second pad, and the first ground pad; and connectors to electrically connect the bonding fingers to via holes that extend through the substrate.

5. The chip package as claimed in claim 4, further comprising a ground layer embedded in the substrate, under the bonding wires.

6. The chip package as claimed in claim 1, wherein the first ground pad is configured to transmit a fixed electric potential to the chip.

7. A chip package comprising, a substrate, and a chip mounted on the substrate, comprising:

first pads consecutively arranged with respect to each other and disposed on the chip and different pads of the first pads are configured to transmit different first signals which are either data signals or control signals;

second pads consecutively arranged with respect to each other and disposed on the chip and different pads of the second pads are configured to transmit different second signals which are address signals; and a first ground pad disposed on the chip between the first pads and the second pads, the first ground pad configured to reduce cross-talk between the first signals and the second signals, third pads consecutively arranged with respect to each other disposed on the chip and different pads of the third pads are configured to transmit different third signals which are one of the data signals and the control signals which are different than the first signals; and a second ground pad disposed on the chip between the second pads and the third pads, the second ground pad configured to reduce cross-talk between the second signals and third signals, wherein the first pads, the first ground pad, the second pads, the second ground pad, and the third pads are consecutively arranged on the chip.

* * * * *